United States Patent
Kato et al.

(10) Patent No.: US 8,273,993 B2
(45) Date of Patent: Sep. 25, 2012

(54) ELECTRONIC COMPONENT MODULE

(75) Inventors: Hiromasa Kato, Fujisawa (JP);
Takayuki Naba, Chigasaki (JP);
Noritaka Nakayama, Yokohama (JP)

(73) Assignees: Kabushiki Kaisha Toshiba, Tokyo (JP);
Toshiba Materials Co., Ltd., Yokohama-shi (JP)

( * ) Notice: Subject to any disclaimer, the term of this patent is extended or adjusted under 35 U.S.C. 154(b) by 1043 days.

(21) Appl. No.: 12/281,856

(22) PCT Filed: Mar. 5, 2007

(86) PCT No.: PCT/JP2007/000169
§ 371 (c)(1),
(2), (4) Date: Sep. 5, 2008

(87) PCT Pub. No.: WO2007/105361
PCT Pub. Date: Sep. 20, 2007

(65) Prior Publication Data
US 2009/0056996 A1 Mar. 5, 2009

(30) Foreign Application Priority Data
Mar. 8, 2006 (JP) .................................. 2006-062706

(51) Int. Cl.
*H05K 1/16* (2006.01)
(52) U.S. Cl. ........................................ 174/260; 174/252
(58) Field of Classification Search .................. None
See application file for complete search history.

(56) References Cited

U.S. PATENT DOCUMENTS

| | | | |
|---|---|---|---|
| 5,837,388 A | 11/1998 | Doko et al. | |
| 6,040,039 A * | 3/2000 | Ikeda et al. | 428/210 |
| 6,221,511 B1 | 4/2001 | Sakuraba et al. | |
| 7,069,645 B2 * | 7/2006 | Ishikawa et al. | 29/830 |
| 2002/0157247 A1* | 10/2002 | Li | 29/840 |
| 2005/0047101 A1* | 3/2005 | Osanai | 361/760 |
| 2005/0217715 A1 | 10/2005 | Sakurada et al. | |

FOREIGN PATENT DOCUMENTS

| | | |
|---|---|---|
| CN | 1140115 A | 1/1997 |
| CN | 1422721 A | 6/2003 |
| JP | 10-098140 A | 4/1998 |
| JP | 2000-323630 A | 11/2000 |
| JP | 2002-201072 A | 7/2002 |
| JP | 2002-203993 A | 7/2002 |
| JP | 2003-204020 A | 7/2003 |
| JP | 2003-309294 A | 10/2003 |
| JP | 2004-095670 A | 3/2004 |
| JP | 2004-221381 A | 8/2004 |
| JP | 2005-032833 A | 2/2005 |
| JP | 2005-286229 A | 10/2005 |
| JP | 2005-353880 A | 12/2005 |
| WO | WO 2006/067986 A1 | 6/2006 |

* cited by examiner

*Primary Examiner* — Ishwarbhai Patel
(74) *Attorney, Agent, or Firm* — Foley & Lardner LLP

(57) ABSTRACT

An electronic component module 1 has a circuit board 2 in which metal plates 5 and 7 are bonded to both surfaces of a ceramic substrate 3, and an electronic component 9 that is bonded to at least one surface of the metal plate 5 and is operable at least 125° C. The electronic component 9 is bonded to the metal plate 5 via a brazing material layer 8 having a higher melting point than a operating temperature of the electronic component 9.

11 Claims, 2 Drawing Sheets

ELECTRONIC COMPONENT MODULE

TECHNICAL FIELD

The present invention relates to an electronic component module.

BACKGROUND ART

As a component to control a large current of an electric vehicle and a train, a power semiconductor module is used. A thermoelectric module is used in an apparatus to perform a power generation with a waste heat, a thermostatic apparatus in a semiconductor process, and an apparatus to cool an electronic device. In these electronic component modules, as a substrate to mount a power semiconductor element or a thermoelectric element, a circuit board in which metal plates are bonded to both surfaces of a ceramic substrate is used (refer to Patent References 1 and 2).

For example, electronic components of the power semiconductor element and the thermoelectric element are soldered on one metal plate of the circuit board, the other metal plate is soldered on a base plate including a metal plate and a composite substrate to be fixed. A structure have been also known, in which a thin semiconductor element is sandwiched between electrode blocks good in an electric conductivity such as copper, and the surroundings are constituted in an airtight seal structure and pressurized from outside of the electrode blocks to integrate plural electronic components (refer to Patent Reference 3).

In the case that electronic components composing the power semiconductor module and the thermoelectric module are Si elements and thermoelectric elements for temperature adjustment, the maximum operating temperature of these is about 125° C., even though, they are fixed by means of soldering with a conventional lead solder and a pressure contact, they can sufficiently endure a uniform heating and a heat cycle (for example, a room temperature to 125° C.).

However, regarding power semiconductor modules and thermoelectric modules in the future, there is a problem, as follows. For example, in the case of using a wide gap semiconductor single crystal element of a high temperature operation type such as SiC element instead of the Si element, they are required to operate under the high temperature environment such as at 300 to 500° C. to exhibit the characteristic sufficiently. In the case when the SiC element operating under the high temperature environment is fixed on a circuit board by conventional soldering, the operation temperature of the SiC element leads the fixing state to the circuit board to be unstable, which causes peeling of the SiC element.

In the case of using a thermoelectric module operable under the high temperature environment, electric energy can be created from a high temperature waste heat of about 500° C. emitted from, for example, a vehicle and a factory, so that reduction of an environmental burden is expected. However, similar to the power semiconductor module, in the case when the thermoelectric element used under the high temperature environment is fixed on a circuit board by conventional soldering, the fixing state of the thermoelectric element to the circuit board can not be maintained stably. In the thermoelectric module, in order to prevent diffusion and release stress, a titanium layer as an intermediate layer is interposed between the thermoelectric element and the electrode (refer to Patent Reference 4). Herein since the intermediate layer and the electrode are formed by thermal spraying method, there is a difficulty in a manufacturability of the thermoelectric module.

In order to improve a fixability of electronic components under the above-described high temperature environment, it is understandable to bond the electronic components such as the SiC element and the thermoelectric element to the circuit board by a high temperature solder. However, in recent years, it is desired to be lead-free of solder, and even in the case of soldering electronic components onto a circuit board, it is desired to use solder not including lead. Since the high temperature solder not including lead has a difficulty in obtaining a characteristic more equivalent to the conventional one, it is practically difficult to bond the electronic components such as the SiC element and the thermoelectric element to the circuit board by the high temperature solder.

Further, in terms of a yield and a reliability, the element size of the semiconductor element and the thermoelectric element is miniaturized, and it is expected that the number of the elements mounted is to be increased significantly by miniaturization of the element size. Therefore, in the power semiconductor module, it is expected that the operating temperature is to be higher and higher. As the operating temperature of the power semiconductor module becomes higher, the heat cycle becomes larger, and an oscillation caused by a thermal deformation and a thermal expansion difference is increased. Accordingly, it makes it easier that the electronic components such as the SiC element are peeled from the circuit board, and it becomes further difficult to secure a reliability.

Patent Reference 1: JP-A 2002-201072 (KOKAI)
Patent Reference 2: JP-A 2002-203993 (KOKAI)
Patent Reference 3: JP-A Hei 10-098140 (KOKAI)
Patent Reference 4: JP-A 2003-309294 (KOKAI)

DISCLOSURE OF THE INVENTION

An object of the present invention is to provide an electronic component module capable of enhancing a reliability by suppressing peeling of electronic components from a circuit board under a high temperature environment.

An electronic component module related to an aspect of the present invention includes a circuit board including a ceramic substrate having a first principal surface and a second principal surface opposite to the first principal surface, a first metal plate bonded to the first principal surface of the ceramic substrate, and a second metal plate bonded to the second principal surface of the ceramic substrate; and an electronic component bonded to at least one of the first and the second metals plates via a brazing material layer and being operable at least at 125° C., wherein the brazing material layer is formed of a brazing material having a higher melting point than a operating temperature of the electronic component.

EXPLANATION OF NUMERALS

1 ... electronic component module, 2 ... circuit board, 3 ... ceramic substrate, 4, 6 ... bonding layer, 5 ... first metal plate, 7 ... second metal plate, 8,10 ... brazing material layer, 9 ... electronic component, 11 ... base plate, 20 ... thermoelectric module, 21 ... case, 22 ... electrode, 23 ... conductive wire, 24 ... insulating substance

BEST MODE FOR CARRYING OUT THE INVENTION

Figure 1:
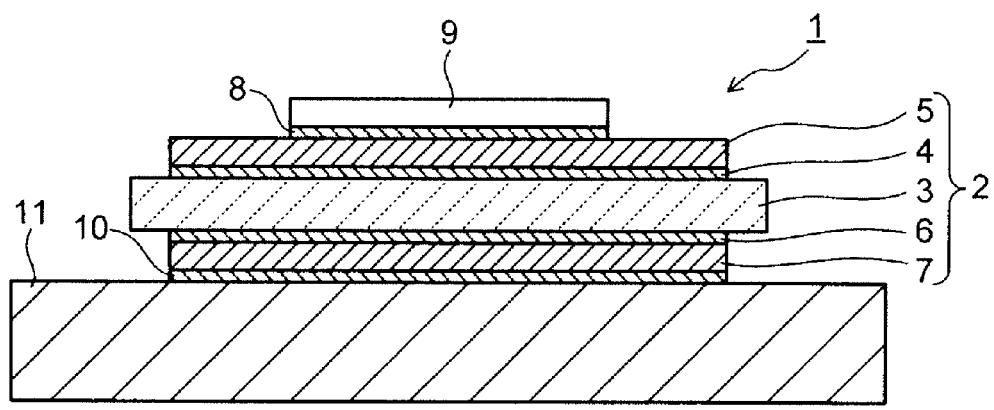
FIG. 1 is a sectional view showing a composition of an electronic component module according to a first embodiment of the present invention.
Figure 2:
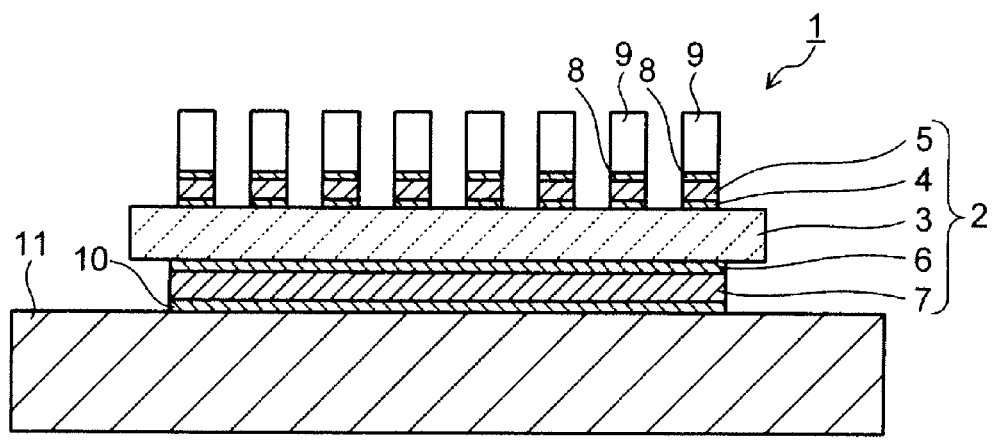
FIG. 2 is a sectional view showing a composition of an electronic component module according to a second embodiment of the present invention.

Hereinafter, embodiments will be explained to perform the present invention. FIG. 1 shows an electronic component module according to a first embodiment of the present invention. FIG. 2 shows an electronic component module according to a second embodiment of the present invention. An electronic component module 1 shown in these views includes a circuit board 2 having a ceramic substrate 3 as an insulating substrate. The circuit board 2 has a first metal plate 5 bonded to one principal surface of the ceramic substrate 3 via a bonding layer 4 and a second metal plate 7 bonded to the other principal surface via a bonding layer 6.

The first metal plate 5 functions as a circuit board. The second metal plate 7 functions, for example, as a bonding plate to a base plate, or as a heat sink plate and a heat absorbing plate. An electronic component 9 is bonded to the first metal plate 5 via a brazing material layer 8. The brazing material layer 8 is formed of a brazing material having a higher melting point than a operating temperature of the electronic component 9. The second metal plate 7 is bonded to a base plate 11 via a brazing material layer 10 composing of a brazing material having a higher melting point than the operating temperature of the electronic component 9.

The ceramic substrate 3 consists of a ceramic sintered compact, such as, for example an alumina ($Al_2O_3$) sintered compact, an aluminum nitride (AlN) sintered compact, a silicon nitride ($Si_3N_4$) sintered compact, and a silicon carbide (SiC) sintered compact. Among them, in terms of having a high thermal conductivity, the aluminum nitride sintered compact is used appropriately. In terms of an intensity being high and enabling a substrate area to be large, the silicon nitride sintered compact is used appropriately.

As the aluminum nitride sintered compact, for example the one whose thermal conductivity is 180 W/m·K or more is used appropriately, and the one that is 200 W/m·K or more is used more appropriately. As these aluminum nitride sintered compacts, for example, as written in JP-A 2002-201072 (KOKAI), the one which a particle diameter of an aluminum nitride particle and a ratio of a grain boundary phase consisting of a sintering aid is adjusted to make the number of aluminum nitride crystal grains included in a direct distance 50 μm be 15 to 30, and the thermal conductivity is 200 W/m·K or more is exemplified.

As the silicon nitride sintered compact, for example, the one whose thermal conductivity is 65 W/m·K or more is used appropriately, and the one whose thermal conductivity is 85 W/m·K or more is used more appropriately. As there silicon nitride sintered compacts, for example, by making a furnace cooling temperature after sintering be 100° C./h or less, the one of which 20% or more (a ratio to the whole grain boundary phase) of the grain boundary phase in the silicon nitride sintered compact is crystallized is exemplified.

As the first and the second metal plates 5 and 7, a metal plate of which at least one selected from copper and aluminum is a main constituent is used. It is preferable to adjust a thickness of these metal plates 5 and 7 to be a range in which a ratio of a thickness t1 of the first metal plate 5 to a thickness t2 of the second metal plate 7 (($t1/t2$)×100"%") is not less than 50% nor more than 200%.

When the ratio of the thickness between the metal plates 5 and 7 ($t1/t2$ ratio) is less than 50% or more than 200%, in either case, a warpage amount of the circuit board 2 obtained by bonding the first metal plate 5 and the second metal plate 7 to the ceramic substrate 3 becomes large, and it becomes difficult that the brazing material layers 8 and 10 are coated in a uniform thickness to bond the electronic component 9 and the base plate 11. Accordingly, in bonding the plural electronic components 9, it is difficult to contact and dispose these evenly on the circuit board 2, and there is a fear that the electronic component 9 bonding insufficiently occurs.

By making the ratio of the thickness between the first and the second metal plates 5, 7 be not less than 50% nor more than 200%, the warpage amount of the circuit board 2, for example, in the case that a size of the circuit board 2 is 60 mm×60 mm or less, can be 15 μm or less. Thus, it makes it possible that the brazing material layers 8 and 10 are coated in a uniform thickness. In the case that there are the plural electronic components 9, it is possible to contact and dispose these collectively and appropriately on the circuit board 2, and to bond. In terms of further decreasing the warpage amount of the circuit board 2, it is preferable that the ratio of the thickness between the metal plates 5 and 7 ($t1/t2$ ratio) is a range that is not less than 75% nor more than 150%, and it is further preferable if it is about 100%. The ratio of the thickness between the metal plates 5 and 7 as such is appropriate especially when an environmental operating temperature is 200° C. or more.

The ceramic substrate 3 and the first and the second metal plates 5 and 7 are bonded via, for example the bonding layers 4 and 6. The bonding layers 4 and 6 are not always required. The ceramic substrate 3 and the first and the second metal plates 5 and 7 can be bonded directly without via the bonding layers 4 and 6. In such a case, formations of the bonding layers 4 and 6 are abbreviated.

The ceramic substrate 3 and the first and the second metal plates 5 and 7 are bonded applying well-known direct bonding methods (a DBC method and a DBA method and the like), an active metal bonding method and a brazing material bonding method and the like. As active metals used in the active metal bonding method, Ti, Zr and Hf and the like are exemplified. Only one of these can be used, or two or more can be used in combination. By applying the active metal bonding method using these active metals, it is possible to bond the ceramic substrate 3 and the first and the second metal plates 5 and 7 tightly.

The electronic component 9 is bonded to a surface of the first metal plate 5 opposite to the surface bonded to the ceramic substrate 3 via the brazing material layer 8. In this manner, the electronic component 9 is mounted on the circuit board 2. The electronic component 9 is operable at least at 125° C., for example, an SiC semiconductor element (a semiconductor element using an SiC single crystal) and a thermoelectric element are exemplified. The electronic component 9 may be the one that is operable under at 125° C. or more, and may be an Si element, a resistor element and a capacitor element and the like which have been used conventionally.

Since a heat cycle (a temperature difference) of the electronic component 9 becomes large due to an operation environmental temperature at 125° C. or more, it is difficult to secure a reliability and a characteristic and the like. In the case of using a wide gap semiconductor element such as an SiC element, it is necessary to make them operate at a high temperature, such as 300 to 500° C. to exhibit the characteristic sufficiently. Since the heat cycle becomes large in making them operate at a high temperature, a load by differences of a thermal deformation and a thermal expansion of each component in the electronic component module 1 is increased, which makes it difficult to secure the reliability. Further, in the case that the number of the elements mounted increases by miniaturizing an element size, an operating temperature becomes higher and higher, and the load by the differences of the thermal deformation and the thermal expansion of each component further becomes large.

In the electronic component module 1 of the embodiment, a brazing material having a higher melting point than the operating temperature of the electronic component 9 is applied to the brazing material layer 8, therefore it is possible to suppress peeling of the electronic component 9 which is operable at least at 125° C. and a characteristic deterioration. For example, in the case of the electronic component 9 being the Si element and the like, since a maximum operating temperature of the Si element is about 125° C., it is possible to suppress peeling of the electronic component 9 and a deterioration in use by applying a brazing material having a higher melting point than the maximum operating temperature (125° C.) of the Si element. Accordingly, it is possible to improve the reliability and the characteristic of the electronic component module 1.

Further, in the case of the electronic component 9 being the SiC element or the thermoelectric element of a high temperature operation type, the operation environmental temperature of these is to be 300° C. or more. By applying a brazing material having a higher melting point than the operation environmental temperature (300° C. or more) of the electronic component 9, such as the SiC element and the thermoelectric element and the like to the brazing material layer 8, it is possible to suppress peeling of the electronic component 9 and a deterioration in the case of using under a high temperature environment. Accordingly, it allows the reliability and the characteristic of the electronic component module 1 to be improved. As the thermoelectric element, Half-Heusler compounds written in JP-A 2005-286229 (KOKAI) and the like are exemplified. If it is such a thermoelectric element, it is applicable under the environmental temperature at 300° C. or more.

The electronic component module 1 of this embodiment is applied to the electronic component 9 operable at least at 125° C. Especially, in the case when the electronic component 9 operable under the environmental temperature at 300° C. or more is modularized, the electronic component module 1 of this embodiment is appropriate. The operating temperature of the electronic component 9 which becomes a reference to a melting point of the brazing material composing of the brazing material layer 8 indicates the maximum operating temperature in the case of the common electronic component 9 such as the Si element, and the operation environmental temperature in the case of the electronic component 1 of the high temperature operation type such as the SiC element or the thermoelectric element.

The base plate 11 is bonded to a surface of the second metal plate 7 opposite to the surface bonded to the ceramic substrate 3 via the brazing material layer 10. As the base plate 11, the one of which at least one selected from, for example, copper and aluminum is a main constituent is appropriate. In such a base plate 11 as well, since it is bonded to the second metal plate 7 with the brazing material layer 10 consisting of a brazing material having a higher melting point than the operating temperature of the electronic component 9, it is possible to suppress peeling of the base plate 11 in use of the electronic component module 1.

In terms of securing a heat release performance of the electronic component module 1 sufficiently, it is preferable to bond the base plate 11 to the second metal plate 7. However, the base plate 11 is not always bonded if it is possible to secure the heat release performance sufficiently without bonding the base plate 11. In this case, the second metal plate 7 functions as a heat sink plate.

The brazing material layer 8 is formed on an area where is bonded to the electronic component 9 on the first metal plate 5. Similarly, the brazing material layer 10 is formed on an area where is bonded to the base plate 11 on the second metal plate 7. The brazing material layers 8 and 10 are required to form on at least such areas, however it may be formed on other areas within a range of not causing trouble to the insulation performance.

The brazing material layers 8 and 10 are consisted of a brazing material having a higher melting point than the operating temperature of the electronic component 9 (the electronic component module 1). By bonding the electronic component 9 and the base plate 11 with the brazing material layers 8 and 10 as such, it is possible to suppress softening of the brazing material layers 8 and 10 in use of the electronic component module 1, and further peeling of the electronic component 9 and the base plate 11 and the like. Further, since a heat stress caused by a thermal expansion difference between the first metal plate 5 and the electronic component 9 is alleviated, it is possible to suppress peeling of the electronic component 9 and a characteristic deterioration and the like. Thus, it is to be possible to provide the electronic component module 1 being excellent in a reliability and an operation characteristic.

Since the electronic component module 1 has the electronic component 9 operable at least at 125° C., a melting point of a brazing material composing of the brazing material layers 8 and 10 is required to be higher than at least 125° C. By using the brazing material having such a melting point, it is to be possible to enhance sufficiently the reliability and the operation characteristic and the like of the electronic component module 1 to which the electronic component 9 such as the Si element whose maximum operating temperature is about 125° C. is applied.

In the case of the electronic component 9 being the SiC element, the operation environmental temperature is to be 300 to 500° C. Therefore, a brazing material composing the brazing material layers 8 and 10 needs to have a higher melting point than the operation environmental temperature (300° C. or more) of the SiC element. Further, in the case of the electronic component 9 being the thermoelectric element of the high temperature operation type, it is exposed to a high temperature waste heat, for example at about 500° C. Thus, a brazing material composing the brazing material layers 8 and 10 needs to have a higher melting point than the high temperature environment to which the thermoelectric element is exposed. Regardless of a kind of the electronic component 9, the electronic component module 1 only has to be the one of which the brazing material layers 8 and 10 are composed of a brazing material having a higher melting point than a practical operating temperature of the electronic component module 1.

As a brazing material composing the brazing material layers 8 and 10, an Ag—Cu based brazing material having a eutectic composition and an Al based brazing material are exemplified. The Ag—Cu based brazing material and the Al based brazing material that have a melting point at 600° C. or more are appropriate. By using the Ag—Cu based brazing material and the Al based brazing material as such, not only in the case of the maximum operating temperature of the electronic component 9 being at about 125° C., but also in the case that the SiC element and the thermoelectric element of the high temperature operation type whose operation environmental temperature are 300° C. or more, as the electronic component 9 are applied, it is possible to suppress peeling of the electronic component 9 and the base plate 11 from the circuit board 2 and a characteristic deterioration of the electronic component 9.

Further, by using the Ag—Cu based brazing material and the Al based brazing material, it is possible to realize a lead-free of the electronic component module 1. In the case of the Ag—Cu based brazing material and the Al based brazing material being used, plating to improve a solder wettability is not required to perform, therefore, it is possible to realize a reduction and the like of a manufacturing man hour of the electronic component module 1.

As the Ag—Cu based brazing material, a total content of two elements, Ag and Cu is 85% or more by mass, and it is preferable to have an electric conductivity. If the total content of the two elements, Ag and Cu is less than 85% by mass, there is a fear that bonding of the first metal plate 5 and the electronic component 9 or bonding of the second metal plate 7 and the base plate 11 is to become difficult. Even though bonding itself is capable, a void and the like occur, and there is a fear that a bonding strength is lowered.

It is preferable that the Ag—Cu based brazing material concretely contains the two elements, Ag and Cu at 85% or more by mass in total, and further at least one selected from Ti, Zr and Hf in a range of not less than 1% by mass nor more than 5% by mass, and the balance of at least one selected from Sn and In. Regarding a ratio between Ag and Cu, when a total amount of Ag and Cu is set to 100 parts by mass, it is preferable that a ratio of Cu is set in a range of 10 to 35 parts by mass, and the remainder is set to be Ag, and it is desirable to set a ratio that satisfies, especially the eutectic composition.

By containing at least one selected from Ti, Zr and Hf in a range of 1 to 5% by mass in the Ag—Cu based brazing material, it is possible to suppress occurrence of a void and the like, making a melting point high and improving a bonding strength. In the Ag—Cu based brazing material, the one in which the two elements, especially Ag and Cu are contained at 85% or more by mass in total, and Ti is contained in a range of not less than 1% by mass nor more than 5% by mass, and the reminder is Sn, is appropriate.

As the Al based brazing material, a content of Al is 90% or more by mass, and it is preferable to have an electric conductivity. If the content of Al is less than 90% by mass, there is a fear that bonding of the first metal plate 5 and the electronic component 9 or bonding of the second metal plate 7 and the base plate 11 is to become difficult. And also, even though bonding itself is capable, a void and the like occur, and there is a fear that a bonding strength is lowered.

It is preferable that the Al based brazing material concretely contains Al at 90% or more by mass, at least one selected from a rare-earth element such as Y and a lanthanoid element in a range of not less than 0.1% by mass nor more than 3% by mass and the balance of Si. By including the rare-earth element of 0.1 to 3% by mass in the Al based brazing material, it is possible to suppress occurrence of a void and the like, making a melting point high and improving a bonding strength. In the Al based brazing material, the one in which especially, Al of 90% or more by mass and Y of 0.1 to 3% by mass are contained, and the remainder is Si is appropriate.

Next, a manufacturing method of the electronic component module 1 of the above-described embodiment will be explained. The circuit board 2 is manufactured prior to manufacturing the electronic component module 1. Namely, the first metal plate 5 and the second metal plate 7 are bonded to both principal surfaces of the ceramic substrate 3 by means of a well-known bonding method to manufacture the circuit board 2.

A paste of a brazing material having a higher melting point than the operating temperature of the electronic component 9 is coated on at least an area where the electronic component 9 is to be bonded out of the surface of the first metal plate 5 of the circuit board 2 by means of, for example, a screen printing to let it dry. And also, a paste of the similar brazing material is coated on at least an area where the base plate 11 is to be bonded out of the surface of the second metal plate 7 by means of, for example, the screen printing to let it dry.

Further, after the electronic component 9 and the base plate 11 are contacted and disposed on the brazing material paste coated on the first metal plate 5 and the second metal plate 7, the whole of these are heated at about a melting point of the brazing material, and the electronic component module 1 is manufactured by bonding the first metal plate 5 and the electronic component 9, and the second metal plate 7 and the base plate 11. On this occasion, in the case that there are the plural electronic components 9, all of these are collectively contacted and disposed on the coated brazing material paste to be bonded. By doing this, it is possible to bond the plural electronic components 9 onto the first metal plate 5 collectively and evenly. Further, the base plate 11 is bonded to the second metal plate 7 simultaneously.

And next, a specific example of the electronic component module 1 according to first and second embodiments will be explained. The first embodiment shown in FIG. 1 is appropriate for the electronic component module 1 in which the semiconductor elements such as the Si element and the SiC element as the electronic component 9 are mounted on the circuit board 2. The electronic component module 1 shown in FIG. 1 is, for example, a power semiconductor module. It is favorable that the electronic component 9 is the SiC element operable, for example, under the high temperature environment at 300° C. or more. In the case that the Si element and the SiC element are applied as the electronic component 9, as shown in FIG. 2, it is possible to structure the electronic component module 1 mounting the plural electronic components 9 on the circuit board 2.

In the electronic component module (the power semiconductor module) 1 mounting the semiconductor elements such as the Si element and the SiC element as the electronic component 9, by using the brazing material layers 8 and 10 having a higher melting point than the operating temperature of the electronic component 9, it is possible to suppress peeling of the electronic component 9 and the base plate 11 from the circuit board 2 and a characteristic deterioration and the like of the electronic component 9.

Further, since the Ag—Cu based brazing material and the Al based brazing material applied to the brazing material layers 8 and 10 can thin a thickness compared to a conventional solder layer, a thermal resistance between the circuit board 2 can be decreased. The thickness of the brazing material layers 8 and 10 composing of the Ag—Cu based brazing material and the Al based brazing material is to be, for example, 30 μm or less, further 10 μm or less. It is favorable that the thickness of the brazing material layers 8 and 10 is to be 3 μm or more. In the case of the thickness of the brazing material layers 8 and 10 being less than 3 μm, there is a fear that a sufficient bonding strength is not obtained. Accordingly, it is possible to enhance a heat cycle characteristic (TCT characteristic) of a power semiconductor module 1.

Figure 3:
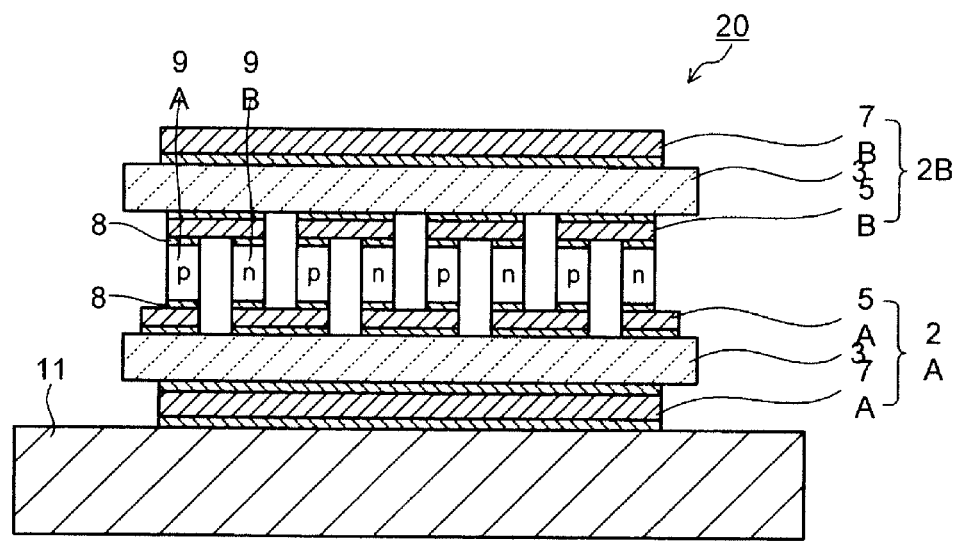
FIG. 3 is a sectional view showing one example of a thermoelectric module applied to the electronic component module according to the second embodiment of the present invention.

The second embodiment shown in FIG. 2 is appropriate for the electronic component module 1 mounting the thermoelectric element as the electronic component 9 on the circuit board 2. It is favorable that the electronic component 9 is the thermoelectric element of the high temperature operation type operable under the high temperature environment, for example at 300° C. or more, further at about 500° C. As a composing material of the thermoelectric element as such, a thermoelectric material (a Half-Heusler material) that an intermetallic compound phase having an MgAgAs crystal structure is a main phase is exemplified. A specific composition of the thermoelectric module is shown in FIG. 3. A thermoelectric module 20 shown in FIG. 3 has plural p-type thermoelectric elements 9A and plural n-type thermoelectric elements 9B. These p-type thermoelectric elements 9A and n-type thermoelectric elements 9B are arranged alternately on a same plane, and disposed in a matrix shape as a whole module.

The p-type thermoelectric elements 9A and the n-type thermoelectric elements 9B are disposed between a first circuit board 2A and a second circuit board 2B. In a lower part of one p-type thermoelectric element 9A and one n-type thermoelectric element 9B adjacent to thereto, a first metal plate 5A of the first circuit board 2A is disposed as a first electrode connecting between these elements. On the other hand, in an upper part of one p-type thermoelectric element 9A and one n-type thermoelectric element 9B adjacent thereto, a first metal plate 5B of the second circuit board 2B is disposed as a second electrode connecting between these elements. The metal plate 5A as the first electrode and the metal plate 5B as the second electrode are disposed in a displaced state by one element.

Accordingly, the plural p-type thermoelectric elements 9A and the plural n-type thermoelectric elements 9B are connected in series electrically. Namely, a first electrode 5A and a second electrode 5B are arranged respectively through which a direct current passes in the order of the p-type thermoelectric element 9A, the n-type thermoelectric element 9B, the p-type thermoelectric element 9A, and the n-type thermoelectric element 9B. The p-type thermoelectric element 9A and the n-type thermoelectric element 9B, and the electrodes (the metal plates) 5A and 5B, as described above, are bonded via the brazing material layer 8 having a higher melting point than the operation environmental temperature of the thermoelectric elements 9A and 9B. A second metal plate 7A of the first circuit board 2A is bonded to the base plate 11.

The thermoelectric module 20 shown in FIG. 3 is used to dispose the first circuit board 2A on a low temperature side (L) and also the second circuit board 2B on a high temperature side (H) so that a temperature difference is given between the upper and the lower circuit boards 2A and 2B. Based on the temperature difference, a potential difference occurs between the first electrode 5A and the second electrode 5B, and electricity can be generated when a load is connected to a termination of the electrodes. Accordingly, it is possible to use the thermoelectric module 20 as a power generating device by using the thermoelectric elements 9A and 9B of the high temperature operation type.

In the thermoelectric module 20 mounting the thermoelectric elements 9A and 9B, by using the brazing material layer 8 having a higher melting point than the operation environmental temperature of the thermoelectric elements 9A and 9B, it is possible to suppress peeling of the thermoelectric elements 9A and 9B from the circuit board 2 and a characteristic deterioration and the like. Further, it is favorable that the thickness of the first electrode (the first metal plate 5B of the first circuit board 2A) disposed on the high temperature side (H) is to be thinner than the thickness of the second electrode (the first metal plate 5A of the second circuit board 2B) disposed on the low temperature side (L). Accordingly, it is possible to further enhance the heat cycle characteristic (the TCT characteristic) of the thermoelectric module 20. It is possible to improve the heat cycle characteristic and the like under the operation environment, especially where the temperature difference between the high temperature side (H) and the low temperature side (L) is 300° C. or more, further 400° C. or more.

It is possible to use the thermoelectric module 20 not only for electricity generation that converts heat into electricity, but also for heating that converts electricity into heat. Namely, when a direct current is passed through the serially connected p-type thermoelectric element 9A and the n-type thermoelectric element 9B, heat release occurs on one circuit board side, and heat absorption occurs on the other circuit board side. Therefore, by disposing a processing target on a circuit board of a heat release side, the processing target can be heated. For example, a temperature control of a semiconductor wafer is performed in a semiconductor manufacturing apparatus, and the thermoelectric module 20 is applied in such a temperature control.

Figure 4:
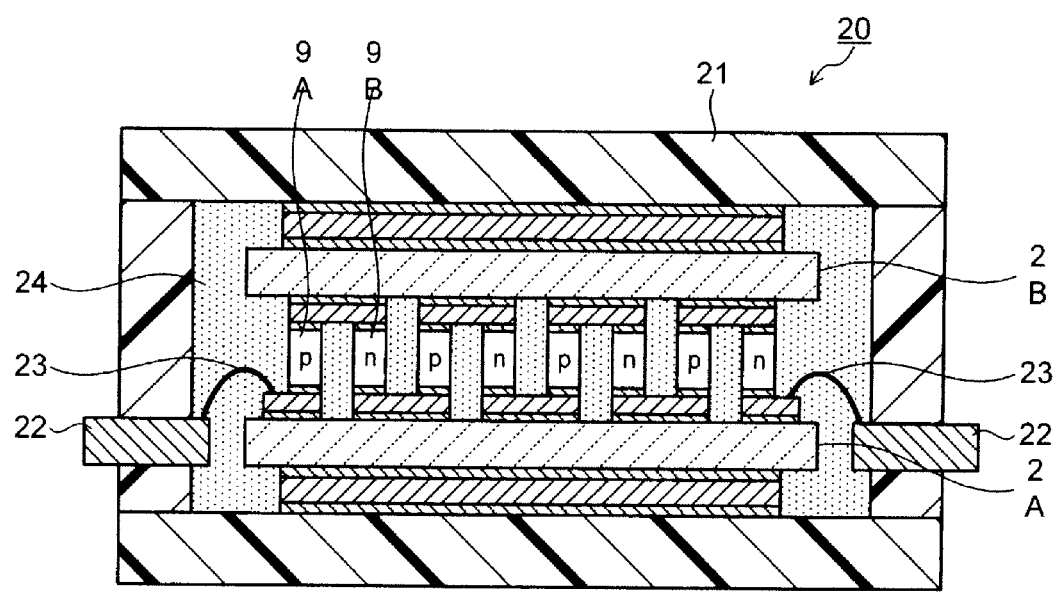
FIG. 4 is a sectional view showing other example of the thermoelectric module applied to the electronic component module according to the second embodiment of the present invention.

The thermoelectric module 20, as shown in FIG. 4, can be accommodated in a case 21. The thermoelectric module 20 is connected electrically via an electrode 22 and a conductive wire 23 provided in the case 21. An insulating substance 24 is filled to seal the thermoelectric module 20 in the case 21. As the insulating substance 24, a gelled sealant such as a silicone gel and the like, for example, is used appropriately. A sealing structure by means of the case 21 is effective not only for the thermoelectric module 20, but also for the power semiconductor module.

And next, a result from that the electronic component module 1 shown in FIG. 2 is manufactured and evaluated actually about the influence that a melting point and a composition of a brazing material composing of the brazing material layer 8 of the electronic component module 1, and further a ratio of the thickness of the first metal plate 5 to the thickness of the second metal plate 7 give to bondability and an operable temperature of the electronic component module 1, will be described. Herein, a structure that the brazing material layer 10 and the base plate 11 are not provided in the electronic component module 1 was applied.

An electronic component module to be a target of evaluation was manufactured as follows. Namely the ceramic substrate 3 consisting of an $Si_3N_4$ sintered compact whose size is 30 mm long×35 mm width×0.32 mm thick, whose thermal conductivity is 90 W/m·K, and whose three-point bending strength is about 500 MPa was prepared. A brazing material including an active metal is printed in a thickness of 15 μm on both sides of the ceramic substrate 3, and further the first metal plate 5 and the second metal plate 7 were contacted on the respective brazing materials, and bonded with a thermal treatment at 800° C. for 10 minutes in a vacuum of $1\times10^{-3}$ Pa.

Herein, the thickness t2 of the second metal plate 7 was constant at 0.25 mm, and the thickness t1 of the first metal plate 5 set a ratio to the thickness t2 of the second metal plate 7 (($t1/t2$)×100[%]) to be a value indicated in Table 1. As the first metal plate 5 and the second metal plate 7, a Cu plate was used. And an etching resist is printed in a predetermined shape on the first metal plate 5, and after a circuit pattern was formed by performing an etching process with a ferric chloride solution, the etching resist was removed to be the circuit board 2.

A brazing material having a melting point and a composition indicated in Table 1 is printed on an area where the electronic component 9 of the first metal plate 5 is bonded in a thickness of 20 μm. The brazing material of the printed area is to be the brazing material layer 8. An Ag—Cu alloy mainly composing of the Ag—Cu based brazing material indicated in Table 1 has the eutectic composition of which an amount of Cu is 28% by mass to a total amount of Ag and Cu. The thickness of a brazing material layer after bonding was within a range of 10 to 15 μm.

After that, a p-type thermoelectric element (a p-type semiconductor element) and an n-type thermoelectric element (an n-type semiconductor element) as the electronic component 9 were contacted in order and disposed on the area where the brazing material of the first metal plate 5 was printed, and bonded with the thermal treatment at 800° C. for 10 minutes. The number of the thermoelectric elements disposed was to be 72. In this manner, the electronic component module 1 (the brazing material layer 10 and the base plate 11 were not provided) having the structure shown in FIG. 2 was obtained.

In the electronic component module 1 whose bondability (before TCT and after TCT) was good, it was practically operated under the conditions of 300° C. or 500° C., and tested whether or not it is operable. The result is indicated in Table 2 in combination. "Up to 500° C." in Table 2, indicates that operating at 300° C. or 500° C. was confirmed. "Up to 300° C." indicates that operating at 300° C. was confirmed, however that operating at 500° C. was not confirmed.

TABLE 1

| SAMPLE No. | RATIO OF THICKNESS OF METAL PLATE [%] | COMPOSITION OF BRAZING MATERIAL (BRAZING MATERIAL LAYER) | MELTING POINT OF BRAZING MATERIAL (BRAZING MATERIAL LAYER) [° C.] |
|---|---|---|---|
| 1 | 100 | Ag—Cu(95wt%) + Ti(5wt%) | 710 to 730 |
| 2 | 100 | Ag—Cu(80wt%) + Ti(4wt%) + REMINDER Sn | 710 to 730 |
| 3 | 100 | Ag—Cu(85wt%) + Ti(4wt%) + REMINDER Sn | 710 to 730 |
| 4 | 100 | Ag—Cu(90wt%) + Ti(4wt%) + REMINDER Sn | 710 to 730 |
| 5 | 150 | Ag—Cu(85wt%) + Ti(4wt%) + REMINDER Sn | 710 to 730 |
| 6 | 100 | Ag—Cu(50wt%) + Ti(4wt%) + REMINDER Sn | 710 to 730 |
| 7 | 50 | Ag—Cu(95wt%) + Ti(5wt%) | 710 to 730 |
| 8 | 75 | Ag—Cu(90wt%) + Ti(4wt%) + REMINDER Sn | 710 to 730 |
| 9 | 200 | Ag—Cu(90wt%) + Ti(4wt%) + REMINDER Sn | 710 to 730 |
| 10 | 40 | Ag—Cu(90wt%) + Ti(4wt%) + REMINDER Sn | 710 to 730 |
| 11 | 220 | Ag—Cu(90wt%) + Ti(4wt%) + REMINDER Sn | 710 to 730 |
| 12 | 250 | Ag—Cu(90wt%) + Ti(4wt%) + REMINDER Sn | 710 to 730 |
| 13 | 100 | Al(95 wt %) + REMINDER Si | 710 to 730 |
| 14 | 100 | Al(90wt%) + Y(1.0wt%) + REMINDER Si | 575 to 610 |
| 15 | 100 | Al(85wt%) + Y(1.0wt%) + REMINDER Si | 575 to 610 |
| 16 | 40 | Al(90wt%) + Y(1.0wt%) + REMINDER Si | 575 to 610 |
| 17 | 50 | Al(90wt%) + Y(1.0wt%) + REMINDER Si | 575 to 610 |
| 18 | 200 | Al(95wt%) + REMINDER Si | 710 to 730 |
| 19 | 250 | Al(90wt%) + Y(1.0wt%) + REMINDER Si | 575 to 610 |

And next, in each electronic component module 1, a bonding state of the electronic component 9 was examined visually, and a bonding strength of the one capable of bonding was measured (bondability before TCT). Further, for each electronic component module 1, as one cycle set as −50° C.×30 minutes to a room temperature×10 minutes to 155° C.×30 minutes to a room temperature×10 minutes, a thermal cycle test was conducted for 3000 cycles After that, a bonding maintenance of the electronic component 9 was examined visually. The bonding strength of the one capable of maintaining the bonding was measured (bondability after TCT). These results are indicated in Table 2.

In Table 2, "good" of bondability before TCT indicates that bonding possibility was confirmed visually, and together the bonding strength was 9.8 kN/m or more. "Defect" of bondability before TCT indicates that bonding possibility was confirmed visually, though the bonding strength was less than 9.8 kN/m. "Impossible bonding" of bondability before TCT indicates that bonding impossible was confirmed visually.

"Good" of bondability after TCT indicates that bonding maintained was confirmed visually, and together the bonding strength of 9.8 kN/m or more is maintained. "Defect" of bondability after TCT indicates that bonding maintained was confirmed visually, though the bonding strength was less than 9.8 kN/m. "Impossible bonding maintenance" of bondability after TCT indicates that bonding not maintained was confirmed visually.

TABLE 2

| SAMPLE No. | BONDABILITY | | HIGH TEMPERATURE OPERATION CONFIRMATION |
|---|---|---|---|
| | BEFORE TCT | AFTER TCT | |
| 1 | GOOD | GOOD | UP TO 300° C. |
| 2 | DEFECT | IMPOSSIBLE BONDING MAINTENANCE | — |
| 3 | GOOD | GOOD | UP TO 500° C. |
| 4 | GOOD | GOOD | UP TO 500° C. |
| 5 | GOOD | GOOD | UP TO 500° C. |
| 6 | IMPOSSIBLE BONDING | — | — |
| 7 | GOOD | GOOD | UP TO 300° C. |
| 8 | GOOD | GOOD | UP TO 500° C. |
| 9 | GOOD | GOOD | UP TO 300° C. |
| 10 | DEFECT | IMPOSSIBLE BONDING MAINTENANCE | — |
| 11 | DEFECT | IMPOSSIBLE BONDING MAINTENANCE | — |
| 12 | IMPOSSIBLE BONDING | — | — |
| 13 | GOOD | GOOD | UP TO 300° C. |
| 14 | GOOD | GOOD | UP TO 500° C. |
| 15 | GOOD | DEFECT | — |
| 16 | GOOD | DEFECT | — |
| 17 | GOOD | GOOD | UP TO 300° C. |
| 18 | GOOD | GOOD | UP TO 500° C. |
| 19 | IMPOSSIBLE BONDING | — | — |

As apparent from Table 1 and Table 2, as a brazing material composing the brazing material layer 8, it is understandable that the Ag—Cu based brazing material of which a total content of two elements, especially Ag and Cu is 85 wt % or more, or the Al based brazing material of which a content of Al is 90 wt % or more is preferable. It is preferable that a ratio of the thickness of the first metal plate 5 to the thickness of the second metal 7 is not less than 50% nor more than 200%, and it is more preferable if it is not less than 75% nor more than 150%.

And next, the power semiconductor module whose structure is shown in FIG. 1 was manufactured, and its TCT characteristic was measured and evaluated. A circuit board was the one similar to the above-described specific example. As the electronic component 9, the SiC element was applied. The SiC element was bonded to the circuit board with a brazing material having a similar composition to sample 3 and sample 13 in Table 1. The power semiconductor module using the similar brazing material of sample 3 was sample 20, and the power semiconductor module using a similar brazing material of sample 13 was sample 21. The TCT characteristic of these power semiconductor modules was evaluated as follows.

For each power semiconductor module bonding the SiC element using a brazing material layer having a composition similar to sample 3 and sample 13, as one cycle set as 25° C.×10 minutes to 300° C.×10 minutes, the thermal cycle test was conducted for 3000 cycles. Further, the thermal cycle test as one cycle set as 25° C.×10 minutes to 500° C.×10 minutes, and the thermal cycle test as one cycle set as 25° C.×10 minutes to 600° C.×10 minutes were conducted respectively for 3000 cycles. Presence/absence of bonding defect after these respective thermal cycle tests was confirmed. These results are indicated in Table 3.

point of a brazing material was low in sample 21 (An Al—Si based brazing material), the TCT characteristic was lowered at 500° C. or more. Accordingly, it is understandable that a bonding reliability is maintained until at the temperature 200° C. lower than a melting point of a brazing material.

And next, the thermoelectric module whose structure is shown in FIG. 3 is manufactured, and the TCT characteristic was measured and evaluated. But the thermoelectric modules (sample 22 to 26) were manufactured changing a ratio between the thickness T1 of the first electrode 5A disposed on the high temperature side (H) and the thickness T2 of the second electrode 5B disposed on the low temperature side (L), as shown in Table 4. The TCT characteristic of these respective thermoelectric modules was evaluated as follows.

Namely, 25° C. was set on the low temperature side (L), and 200° C. or 500° C. was set on the high temperature side (H), and as one cycle set as 25° C.×10 minutes to 200° C. or 500° C.×30 minutes, the thermal cycle test was conducted for 3000 cycles. The operation of the thermoelectric module after each thermal cycle test is confirmed. The one operated even after a TCT test was regarded as "good" and the one not operated was regarded as "defect". The thermoelectric module operating even after the TCT test means that bonding defect between the thermoelectric module and the electrode does not occur. These results are indicated in Table 4.

As the thermoelectric elements 9A and 9B, the thermoelectric material that the intermetallic compound phase having the MgAgAs type crystal structure is the main phase was used. As the circuit board 3, the one that a copper plate as the electrodes 5A and 5B was bonded to a silicon nitride substrate (0.3 mm thick×60 mm width×60 mm long) was used. In bonding of the thermoelectric element and the electrode, and in bonding of the electrode and the silicon nitride substrate, a

TABLE 3

| SAMPLE No. | BRAZING MATERIAL | TCT CHARACTERISTIC UP TO 300° C. | TCT CHARACTERISTIC UP TO 500° C. | TCT CHARACTERISTIC UP TO 650° C. |
|---|---|---|---|---|
| 20 | SAMPLE 3 | ABSENCE OF BONDING DEFECT | ABSENCE OF BONDING DEFECT | PRESENCE OF BONDING DEFECT |
| 21 | SAMPLE 13 | ABSENCE OF BONDING DEFECT | PRESENCE OF BONDING DEFECT | PRESENCE OF BONDING DEFECT |

As apparent from Table 3, by using an Ag—Cu—Ti based brazing material including Sn as a brazing material within a range of 10 to 14% by mass, it is possible to enhance the TCT characteristic at a high temperature. The operation was confirmed until at the temperature 200° C. lower than a bonding temperature of a brazing material, however bonding defect was confirmed significantly at the temperature 100° C. lower than a melting point of a brazing material. Since a melting brazing material having a composition which contains Ag of 69% by mass, Cu of 21% by mass, Ti of 2% by mass and the balance of Sn was used. The thickness of the brazing material layer after bonding is to be 10 to 15 μm. 64 pieces (8×8) of the thermoelectric elements (9A and 9B) were bonded on the circuit board 3. As a reference example (sample 27), the one that a Ti layer with a thickness of 20 μm was used in a bonding layer was prepared.

TABLE 4

| SAMPLE No. | THICKNESS T1 (mm) | THICKNESS T2 (mm) | BONDING LAYER | TCT CHARACTERISTIC [HIGH TEMPERATURE SIDE 200° C.] | TCT CHARACTERISTIC [HIGH TEMPERATURE SIDE 500° C.] |
|---|---|---|---|---|---|
| 22 | 0.5 | 0.5 | Ag—Cu—Ti BASED BRAZING MATERIAL LAYER | GOOD | DEFECT |
| 23 | 0.5 | 0.6 | Ag—Cu—Ti BASED BRAZING MATERIAL LAYER | GOOD | GOOD |

TABLE 4-continued

| SAMPLE No. | THICKNESS T1 (mm) | THICKNESS T2 (mm) | BONDING LAYER | TCT CHARACTERISTIC [HIGH TEMPERATURE SIDE 200° C.] | TCT CHARACTERISTIC [HIGH TEMPERATURE SIDE 500° C.] |
|---|---|---|---|---|---|
| 24 | 0.5 | 0.8 | Ag—Cu—Ti BASED BRAZING MATERIAL LAYER | GOOD | GOOD |
| 25 | 0.5 | 1 | Ag—Cu—Ti BASED BRAZING MATERIAL LAYER | GOOD | GOOD |
| 26 | 0.5 | 0.3 | Ag—Cu—Ti BASED BRAZING MATERIAL LAYER | GOOD | DEFECT |
| 27 | 0.5 | 0.5 | Ti LAYER | GOOD | DEFECT |

As apparent from Table 4, in case of the temperature on the high temperature side being 200° C. or less, namely, in the case that the temperature difference between the high temperature side and the low temperature side was 200° C. or less, defect was not confirmed. On the other hand, in the case that the temperature difference between the high temperature side and the low temperature side is 300° C. or more, a TCT characteristic can be enhanced by thinning the thickness T1 of the electrode on the high temperature side rather than the thickness T2 of the electrode on the low temperature side (T1<T2). Meanwhile, as compared among sample 22, sample 26 and sample 27, an occurrence ratio of bonding defect such as peeling of an electrode and the like is 30 out of 64 in the number of the thermoelectric elements in the reference example (sample 27), 23 in sample 26 and 17 in sample 22. This is considered that relaxation of a heat stress is not sufficient enough in a Ti single layer.

The present invention is not limited to the above-described embodiments, and may be variously modified in the range departing from the spirit of the invention in the stage of being carried out. Further, each of the embodiments can be carried out by being properly combined as much as possible, and in this case, the combined effect can be obtained. Further, the above-described embodiments include the invention at the various stages, and various inventions can be extracted by proper combination in a plurality of disclosed features.

INDUSTRIAL APPLICABILITY

According to the electronic component module related the embodiments of the present invention, it is possible to suppress peeling of an electronic component and the like based on the operating temperature. Therefore, it is allowed to provide an electronic component module excellent in reliability. The electronic component module as such is to be used effectively in various electronic components, especially electronic components used under a high temperature environment.

What is claimed is:
1. An electronic component module, comprising:
a circuit board including a ceramic substrate having a first principal surface and a second principal surface opposite to the first principal surface, a first metal plate bonded to the first principal surface of the ceramic substrate, and a second metal plate bonded to the second principal surface of the ceramic substrate; and
an electronic component bonded to at least one of the first and the second metal plates via a first brazing material layer, wherein the electronic component is operable at a temperature of at least 125° C.,
wherein the first brazing material layer is formed of a brazing material having a melting point in a range of 575° C. to 730° C., and the melting point is higher than an operating temperature of the electronic component, and
wherein a ratio of a thickness of the first metal plate to a thickness of the second metal plate is 50% or more and 200% or less.
2. The electronic component module according to claim 1, wherein an operation environmental temperature of the electronic component is 300° C. or more.
3. The electronic component module according to claim 2, wherein the electronic component is an SiC semiconductor element.
4. The electronic component module according to claim 1, wherein the electronic component is bonded to the first metal plate via the first brazing material layer, and
wherein a base plate is bonded to the second metal plate via a second brazing material layer.
5. The electronic component module according to claim 4, wherein the second brazing material layer is formed of the brazing material.
6. The electronic component module according to claim 1, wherein the brazing material is an Ag—Cu based brazing material containing Ag and Cu in a range of 85% or more by mass in total.
7. The electronic component module according to claim 6, wherein the Ag—Cu based brazing material further contains at least one element selected from Ti, Zr and Hf in a range of not less than 1% nor more than 5% by mass and the balance of at least one element selected from Sn and In.
8. The electronic component module according to claim 6, wherein the Ag—Cu based brazing material has a composition of which a rate of Cu is in a range of 10 to 35 parts by mass when a total amount of Ag and Cu is set to be 100 parts by mass.
9. The electronic component module according to claim 1, wherein the brazing material is an Al based brazing material containing Al at 90% or more by mass.
10. The electronic component module according to claim 9, wherein the Al based brazing material further contains at least one element selected from rare-earth elements in a range of not less than 0.1% nor more than 3% by mass and the balance of Si.

11. The electronic component module according to claim 1, further comprising:
a case accommodating the circuit board to which the electronic component is bonded, an electrode provided in the case, and an insulating substance filled in the case to seal the electronic component and the circuit board.

* * * * *